United States Patent
King et al.

(10) Patent No.: US 6,359,514 B1
(45) Date of Patent: Mar. 19, 2002

(54) SWITCHABLE PATH POWER AMPLIFIER WITH COMBINING NETWORK

(75) Inventors: Joel R. King, Hillsboro; Gordon A. Olsen, Tigard, both of OR (US)

(73) Assignee: Maxim Integrated Products, Sunnyvale, CA (US)

( * ) Notice: Subject to any disclaimer, the term of this patent is extended or adjusted under 35 U.S.C. 154(b) by 0 days.

(21) Appl. No.: 09/692,408

(22) Filed: Oct. 19, 2000

Related U.S. Application Data

(63) Continuation of application No. 09/048,935, filed on Mar. 26, 1998, now Pat. No. 6,181,208.

(51) Int. Cl.$^7$ ............................................. H03F 3/60
(52) U.S. Cl. ..................... 330/295; 330/124 R; 330/51; 333/101
(58) Field of Search ................ 330/51, 124 R, 330/295; 333/101

(56) References Cited

U.S. PATENT DOCUMENTS

| | | | |
|---|---|---|---|
| 3,449,685 A | 6/1969 | Holmes | 330/295 |
| 5,175,871 A | 12/1992 | Kunkel | |
| 5,287,543 A | 2/1994 | Wolkstein | 330/124 R |
| 5,438,684 A | * 8/1995 | Schwent et al. | 330/124 R |
| 5,530,923 A | 6/1996 | Heinonen et al. | 330/295 |
| 5,712,593 A | 1/1998 | Vern Bluer et al. | |
| 6,111,459 A | * 8/2000 | Nishijima | 330/51 |
| 6,137,355 A | * 10/2000 | Sevic et al. | 330/51 |
| 6,181,208 B1 | * 1/2001 | King et al. | 330/295 |

FOREIGN PATENT DOCUMENTS

JP    5275251    * 6/1977

* cited by examiner

*Primary Examiner*—Michael B Shingleton
(74) *Attorney, Agent, or Firm*—Oppenheimer Wolff & Donnelly, LLP

(57) ABSTRACT

The present invention teaches a power amplifier having two output power devices and a mechanism for switching the output path between these two power devices. The first output power device is designed for power efficient signal amplification at the power amplifier's highest output power level. The second output power device is designed for power efficient signal amplification at the output power level that the power amplifier is most likely to operate. By switching between the two power devices according to the output power level, a high level of power efficiency can be achieved across a broad range of operating states of the power amplifier.

46 Claims, 2 Drawing Sheets

SWITCHABLE PATH POWER AMPLIFIER WITH COMBINING NETWORK

This is a Continuation application of prior application Ser. No. 09/048,935 filed on Mar. 26, 1998, issued as U.S. Pat. No. 6,181,208 (issuance pending at the present time filing).

DESCRIPTION

1. Technical Field

The present invention is related to power amplifiers such as those used in cellular communications systems. More specifically, the present invention teaches a power amplifier having at least two output power devices and a mechanism for switching the output path between these two power devices. The first output power device is designed for power efficient signal amplification at the power amplifier's highest output power level. The second output power device is designed for power efficient signal amplification at the output power level that the power amplifier is most likely to operate. By switching between the two power devices according to the output power level, a high level of efficiency can be achieved across a broad range of operating states of the power amplifier.

2. Background Art

The power efficiency of an amplification device such as a transistor varies with operating conditions. For example, a power amplifier designed for power efficiency at one supply voltage may well be inefficient at another supply voltage. However, applications abound that require the power amplifier to operate under varying conditions (e.g., different supply voltages) yet would benefit greatly from power efficient operation. In fact, while there are a variety of design constraints that may be imposed upon any power amplifier application, power efficiency is almost invariably a fundamental design objective.

By way of example, in most communication systems it is preferred that the power amplifier operate efficiently yet maintain an acceptable linearity over the desired supply voltage range. To that end, the typical power amplifier is adjusted to achieve a peak efficiency at a single output power level and supply voltage. In general, to operate at peak efficiency requires that the voltage swing at the output of the power amplifier be as large as possible. But, improving efficiency by increasing the voltage swing tends to reduce the linearity of the power amplifier. There is therefore a trade-off between power efficiency and linearity, improvements in one coming at the expense of the other.

Many cellular communication systems, such as the CDMA cellular system, require that the power amplifier deliver a wide range of output powers. For more details regarding CDMA cellular systems, please see the Electronic Industry Association's publication EIA/TIA IS-95, which is incorporated herein by reference in its entirety. As will be appreciated, the power amplifier must safely operate at its highest power level. Being designed for the highest power level, the power amplifier tends to operate less efficiently at lower, more commonly used, power levels. Hence the life of a battery operated device is shortened because efficient power amplification is unavailable at the more commonly used power levels since the power amplifier must be designed for the highest power level.

Communication systems such as CDMA cellular systems merely illustrate one example of the multiplicity of power amplifier applications that require operation at numerous operating states. In order to address the shortcomings of the prior art, what is needed is a power amplifier that can achieve high power efficiency at several operating states.

DISCLOSURE OF THE INVENTION

In order to achieve the foregoing and in accordance with the present invention, a variety of power amplifiers having at least two output power devices and a mechanism for switching the output path between these two power devices are taught herein. The first output power device is designed for power efficient signal amplification at the power amplifier's highest output power level. The second output power device is designed for power efficient signal amplification at the output power level that the power amplifier is most likely to operate. By switching between the two power devices according to the output power level, a high level of efficiency can be achieved across a broad range of operating states of the power amplifier.

A first embodiment of the present invention teaches a switchable path power amplifier suitable for amplifying an input signal received at a power amplifier input in order to generate an output signal at a power amplifier output. In this embodiment, the switchable path power amplifier has a first power device, a second power device, and a combining network device.

The first power device is intended for amplifying the input signal during a first operating state of the switchable path power amplifier and includes a first power device input coupled to the power amplifier input and a first power device output. The second power device is intended for amplifying the input signal during a second operating state of the switchable path power amplifier and includes a second power device input coupled to the power amplifier input and a second power device output. The combining network device includes a first combining network device input coupled to the first power device output, a second combining network device input coupled to the second power device output, and a combining network device output coupled to the power amplifier output. The combining network device is operable to select between the first power device and the second power device such that only one of the first power device and the second power device drives the power amplifier output.

In a related embodiment, the switchable path power amplifier further includes state determination circuitry operable to determine the operating state of the switchable path power amplifier. Typically, the state determination circuitry is arranged to control which power device drives the power amplifier output based upon the desired output power.

In a preferred embodiment, the combining network device includes an inductor L1 having first and second terminals, a capacitor C1 having first and second terminals, an inductor L2 having first and second terminals, a transmission line having first and second terminals, a capacitor C2 having first and second terminals, a capacitor C3 having first and second terminals, an inductor L3 having first and second terminals, and an inductor L4 having first and second terminals. These circuit components are connected as follows.

The first inductor L1 terminal is electrically coupled to the first power device output. The first inductor L2 terminal is coupled to a common ground reference, and the second inductor L2 terminal, the second inductor L1 terminal, and the first capacitor C1 terminal are coupled together. The first transmission line terminal, the second capacitor C1 terminal, and the power amplifier output are coupled together. The second capacitor terminal C2 is coupled to the common ground reference. The first capacitor C3 terminal, the first capacitor C2 termninal, and the second transmission line terminal are coupled together. The first inductor L3 terminal is coupled to the common ground reference. The first inductor L4 terminal is coupled to the second power device output. the second inductor L4 terminal, the second inductor L3 terminal, and the second capacitor C2 terminal are coupled together.

Yet another embodiment of the present invention teaches a switchable path power amplifier suitable for use in an RF communications system. The RF communication system has a first output power level that corresponds to the highest output power required of the RF communications system and a second output power level that corresponds to the output power at which the RF communications system most typically operates.

The switchable path power amplifier has a first power device substantially optimized for power efficient signal amplification at the first output power level, a second power device substantially optimized for power efficient signal amplification at the second output power level, state determination circuitry arranged to determine the power level at which the switchable path power amplifier is operating, and a combining network arranged to decouple a disabled power device from an output load coupled to the switchable path power amplifier such that any effect of the disabled power device upon an amplified electrical signal generated by the enabled power device is negligible. The state determination circuitry is further operable to a) enable the first power device and disable the second power device when the switchable path power amplifier is operating at the first output power level and b) enable the second power device and disable the first power device when the switchable path power amplifier is operating at the second output power level.

A related embodiment of the present invention contemplates a switchable path power amplifier having three or more power devices. In this embodiment, each of the three or more power devices would be suitably designed for a particular operating state (e.g., output power level). The state determination circuitry would therefore operate to enable the appropriate power device, and simultaneously disable to other power devices.

Another aspect of the present invention teaches a method for amplifying an electrical signal over multiple power levels, the amplified electrical signal driving an output load. The method begins by providing a switchable path power amplifier having first and second power devices, the first power device intended for amplifying the electrical signal during a first power level, and the second power device intended for amplifying the electrical signal during a second power level. The method then determines the power level of the switchable path power amplifier, and, when the power level is at the first power level, selects the first power device for use in amplifying the electrical signal. However, when the power level is at the second power level, the method selects the second power device for use in amplifying the electrical signal.

BEST MODES FOR CARRYING OUT THE INVENTION

Figure 1:
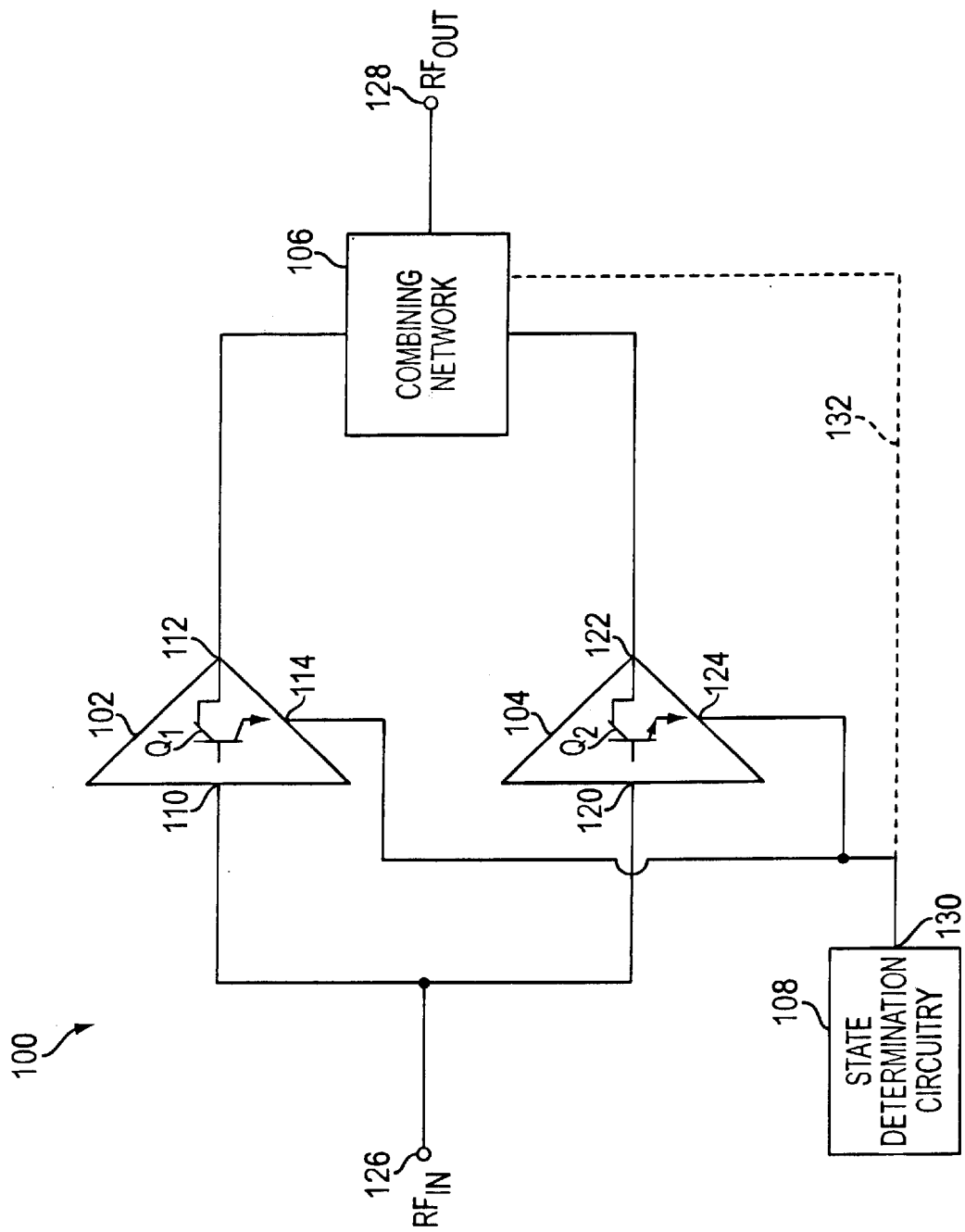
FIG. 1 illustrates a schematic of a switchable path power amplifier in accordance with one embodiment of the present invention.

FIG. 1 illustrates a switchable path power amplifier 100 in accordance with a first embodiment of the present invention. The switchable path power amplifier 100 is well suited for applications such as cellular phones, cordless phones, two way pagers, wireless LANs, and AM and FM analog transmitters. As will be appreciated, depending upon the complexity and/or cost of the system, the power amplifier 100 may serve simply as a driver amplifier, or may be the complete power amplifier for the system.

The switchable path power amplifier 100 includes a first power device 102, a second power device 104, a combining network 106, and state determination circuitry 108. In brief, the two power devices 102 and 104 are designed for power efficient operation at two different output power levels. The combining network 106 and the state determination circuitry work together to switch the output path between the two power devices according to the output power level, thereby achieving power efficiency and acceptable linearity across a broad range of operating states of the power amplifier.

The first power device 102 has a signal input 110, a signal output 112, and an enable input 114. Likewise, the second power device 104 has a signal input 120, a signal output 122, and an enable input 124. A power amplifier input 126 is coupled to both the first power device signal input 110 and the second power device signal input 120. The first power device signal output 112 and the second power device signal output 122 are both coupled to inputs of the combining network 106.

The first and second power devices operate such that, when enabled, an electrical signal applied at the signal input is amplified at the output. In certain embodiments, the first power device 102 is engineered for high power levels and the second power device 104 is designed for low power levels. That is, both the first power device 102 and the second power device 104 provide the maximum voltage swing acceptable for linearity at their respective power levels. The first power device 102 is substantially optimized for power efficiency at the highest output power required of the power amplifier 100. The second power device 104 is substantially optimized for power efficiency at the most used output power level of the power amplifier 100.

The actual implementation of the power devices 102 and 104 varies based upon the goals of the specific application, constraints placed upon the designer, etc. In preferred embodiments, each power device includes a power transistor such as npn transistor Q1 and npn transistor Q2. Each power device will further typically include DC bias circuitry that holds the power transistor in an initial state such that, under "normal" operating conditions, the input signal controls the output of the power transistor. The design and construction of power amplifiers, including generating power devices having power efficiency optimized for certain power levels, is well known to those of skill in the art of electronics.

The state determination circuitry 108 is operable to selectively enable and disable the first and second power devices 102 and 104. In the embodiment of FIG. 1, the state determination circuitry has a single digital output 130 coupled to both the enable input 114 of the first power device 102 and the enable input 124 of the second power device 104. In this case, the enable logic for the first and second power devices 102 and 104 are opposite of one another. Alternatively, the state determination circuitry 108 can be designed with two control outputs coupled separately to the first and second power devices 102 and 104.

The state determination circuitry 108 may include a digital signal processor, a microcontroller, a power level sensor, programmable logic such as PLD or PAL, and/or other suitable circuitry. For example, when the power amplifier 100 is part of a CDMA cellular telephone system, a microcontroller typically operates the system, controlling, among other things, the output power level. Alternatively, the state determination circuitry 108 may be a power level sensor coupled to the power amplifier output 128 directly measuring the output power level. In certain embodiments, the state determination circuitry 108 includes both a digital processor and power level sensor circuitry, and the state determination decision is based upon the direct measurement of the output power level and other information available to the digital processor.

The combining network 106 is coupled to both the signal output 112 of the first power device 102 and the signal output 122 of the second power device 104, as well as being coupled to the power amplifier output 128. Additionally, as shown by hashed line 132, the combining network 106 may be coupled to the state determination circuitry 108. The combining network 106 serves to couple the enabled power device with the power amplifier output 128. The combining network 106 further serves to decouple the disabled power device from the power amplifier output 128, thereby rendering negligible the effect of the disabled power device upon the amplified output signal. The combining network 106 could be implemented by a multiplicity of different circuits including a mechanical relay, a single-pole, double-throw (SPDT) switch, a field effect transistor (FET) switch, a diode switch or a combination of inductor, capacitor, and transmission line components. Several suitable embodiments will be described below with reference to FIGS. 2 and 3.

In preferred embodiments of the power amplifier 100, the first power device 102 and the second power device 104 are formed on a single device. This single device and the combining network 106 are then formed together within a single integrated circuit package. Alternatively, these components could be packaged separately, and then wired together on some suitable mechanism such as a printed circuit board.

The power amplifier 100 of FIG. 1 illustrates the use of just two power devices. However, it is contemplated that more than two power devices could be utilized. In such a case, each power device would be optimized for power efficiency during a specific state (e.g., operating power level) of the power amplifier. Correspondingly, the state determination circuitry 108 and the combining network 106 would operate to select the proper power device, isolating the disabled power devices from the output 128.

Figure 2:
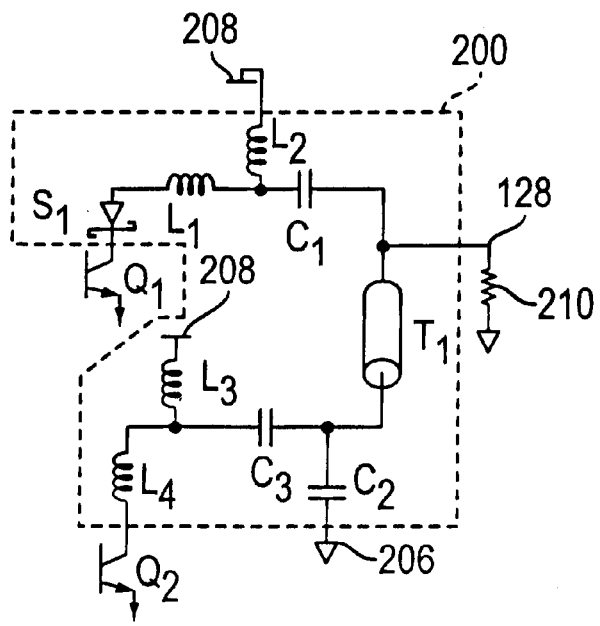
FIG. 2 illustrates a schematic of a combining network suitable for use in the switchable path power amplifier of FIG. 1, the combining network in accordance with another embodiment of the present invention.

FIG. 2 illustrates a combining network 200 in accordance with one embodiment of the present invention. The combining network 200 includes inductors L1–L4, capacitors C1–C3, a diode such as schottky diode S1, and a transmission line T1. Also shown in FIG. 2 are the power device transistors Q1 and Q2, the power amplifier output 128, and an output load 210. The elements of the combining network 200 are coupled together as follows.

The schottky diode S1 acts as an electrical coupling between a first inductor L1 terminal and the transistor Q1, the anode of the schottky diode S1 coupled to the first inductor L1 terminal and the cathode of the schottky diode S1 coupled to the transistor Q1. A first inductor L2 terminal is coupled to a common ground reference 206. A second inductor L2 terminal, a second inductor L1 terminal, and a first capacitor C1 terminal are coupled together. A first transmission line T1 terminal, a second capacitor C1 terminal, and the power amplifier output 128 are coupled together. A second capacitor terminal C2 is coupled to a common supply voltage 208. A first capacitor C3 terminal, a first capacitor C2 terminal, and a second transmission line T1 terminal are coupled together. A first inductor L3 terminal is coupled to the common voltage reference 208. A first inductor L4 terminal is coupled to the transistor Q2. A second inductor L4 terminal, a second inductor L3 terminal, and a second capacitor C2 terminal are coupled together.

The combining network 200 operates as follows. When the power device 104 (i.e., Q2) is enabled, no current flows through the schottky diode S1 and it presents a high impedance to the power amplifier output 128. Accordingly, most of the power generated by the enabled power device 104 is delivered to the output load 210. Assuming the output load 210 has a nominal impedance of 50 Ohms, the transmission line T1 should be selected as a 50 Ohm transmission line, $\lambda/4$ in length. Since the output load 210 is 50 Ohms, the transmission line T1 does not change the impedance seen by the power device 104. When the power device 102 (i.e., Q1) is enabled, the transmission line T1 acts like an open circuit because of the low output impedance of the path to the power device 104. (As will be appreciated, a $\lambda/4$ transmission line terminated in a short circuit presents an infinite impedance to the side opposite the short circuit termination.)

In the embodiment of FIG. 2, the components L1–L4 and C1–C3 are selected such that the 50 Ohm output load 210 is seen as the desired impedance. For example, it has been found that when the schottky diode S1 has about 1200 micro meter$^2$ of junction area, the inductor L1 is about 1 nano-Henry, the inductor L2 is about 22 nano-Henry, the inductor L3 is about 22 nano-Henry, the inductor L4 is about 1 nano-Henry, the capacitor C1 is about 1.6 pico-Farad, the capacitor C2 is about 4.2 pico-Farad, and the capacitor C3 is about 11 pico-Farad, the network device 200 works as desired. As will be appreciated, these component values are simply an example suitable for the power levels of a CDMA cellular system, providing a corresponding power efficiency. Those of skill in the art will well understand how to select component values necessary for other applications.

Figure 3:
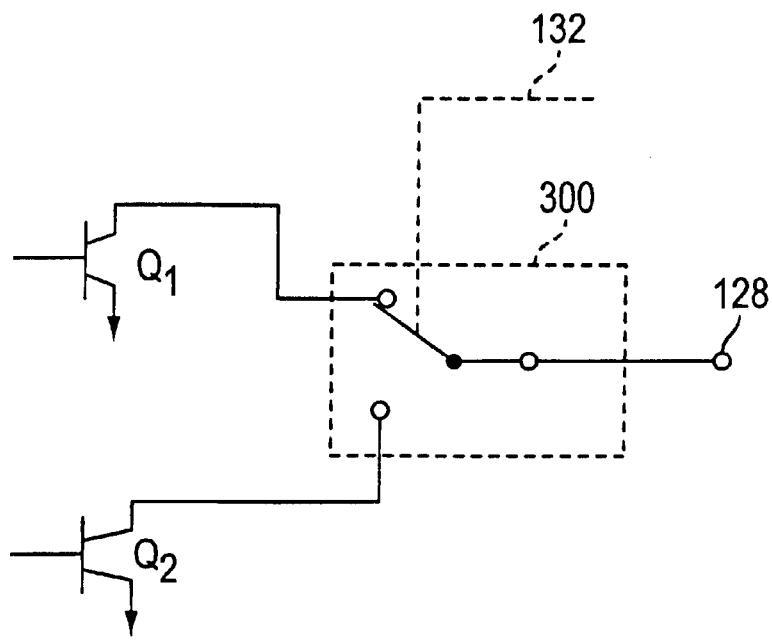
FIG. 3 illustrates a schematic of another combining network suitable for use in the switchable path power amplifier of FIG. 1, the combining network in accordance with yet another embodiment of the present invention.

FIG. 3 illustrates a network device 300 in accordance with another embodiment of the present invention. The network device 300 represents schematically any of the variety of switches, mechanical and electrical, that can be used to switch the path connecting the power amplifier input 126 to the power amplifier output 128. Suitable switches include mechanical relays, single-pole, double-throw switches, transistor and diode switches. As indicated by the connection 132, in the embodiments of FIG. 3, the state determination circuitry 108 not only controls the power devices 102 and 104, the state determination circuitry 108 activates the switch of the network device 300.

Although only a few embodiments of the present invention have been described in detail herein, it should be understood that the present invention may be embodied in many other specific forms without departing from the spirit or scope of the invention.

For example, the power devices such as first and second power devices 102 and 104 of FIG. 1 may each be either linear or nonlinear devices, or even a combination thereof. Additionally, the power devices may utilize any suitable power amplification technology such as bipolar transistor or field effect transistor (FET) technology.

Utilization of different power devices designed for power efficient operation at specific power level was described in some detail above. However, the power devices could be designed for power efficient operation corresponding to other operating conditions such as signal waveform (e.g., digital versus analog), ambient temperature, power supply waveform, etc. In these embodiments, the state determination circuitry would enable the best power device available and disable the others. Likewise, it is contemplated that the power devices could be optimized for other purposes, such as linearity in a certain operating range, and then the state determination circuitry would enable the best power device available based on criteria including something other than power efficiency.

Therefore, the present examples and embodiments are to be considered as illustrative and not restrictive, and the invention is not to be limited to the details given herein, but may be modified within the scope of the appended claims.

What is claimed is:

1. A switchable path power amplifier having a substantially constant gain, the switchable path power amplifier suitable for amplifying an input signal received at a power amplifier input in order to generate an output signal at a power amplifier output, the switchable path power amplifier comprising:
    a first power device including a first power device input coupled to the power amplifier input and a first power device output, the first power device suitable for amplifying the input signal, the first power device intended tor use during a first operating state of the switchable path power amplifier, the first operating state of the switchable path power amplifier functioning at a first gain and a high power level;
    a second power device including a second power device input coupled to the power amplifier input and a second power device output, the second power device suitable for amplifying the input signal, the second power device intended for use during a second operating state of the switchable path power amplifier, the second operating state of the switchable path power amplifier functioning at a second gain and a high power level, the first gain and the second gain being substantially the same; and
    a combining network device including a first combining network device input coupled to the first power device output, a second combining network device input coupled to the second power device output, and a combining network device output coupled to the power amplifier output, the combining network device being operable to select between the first power device and the second power device such that only one of the first power device and the second power device drives the power amplifier output.

2. A switchable path power amplifier as recited in claim 1 wherein the switchable path power amplifier further comprises state determination circuitry operable to determine the operating state of the switchable path power amplifier.

3. A switchable path power amplifier as recited in claim 2 wherein the state determination circuitry is arranged to control which power device drives the power amplifier output based upon the state of the switchable path power amplifier.

4. A switchable path power amplifier as recited in claim 3 wherein the state determination circuitry enables the first power device and disables the second power device when the switchable path power amplifier is operating in the first state.

5. A switchable path power amplifier as recited in claim 4 wherein the state determination circuitry enables the second power device and disables the first power device when the switchable path power amplifier is operating in the second state.

6. A switchable path power amplifier as recited in claim 5 wherein the combining network device selects the enabled power device as the power device that drives the power amplifier output.

7. A switchable path power amplifier as recited in claim 6 wherein the combining network device includes a single-pole double-throw (SPDT) switch coupled between the first power device output, the second power device output, and the power amplifier output.

8. A switchable path power amplifier as recited in claim 6 wherein the combining network device is an active switch coupled between the first power device output, the second power device output, and the power amplifier output.

9. A switchable path power amplifier as recited in claim 8 wherein the active switch is a field effect transistor (FET) switch.

10. A switchable path power amplifier as recited in claim 8 wherein the switch is a diode switch.

11. A switchable path power amplifier as recited in claim 1 wherein the first power device is designed specifically for power efficient operation at the high power level, and the second power device is designed specifically for power efficient operation at the low power level.

12. A switchable path power amplifier as recited in claim 11 wherein the first power device includes a first transistor having an output that is the first power device output, and the second power device includes a second transistor having an output that is the second power device output.

13. A switchable path power amplifier as recited in claim 12 wherein the first and second transistors are npn transistors.

14. A switchable path power amplifier as recited in claim 12 wherein the first and second transistors are field effect transistors.

15. A switchable path power amplifier as recited in claim 2 wherein the state determination circuitry includes circuitry for sensing an output power.

16. A switchable path power amplifier as recited in claim 2 wherein the state determination circuitry includes a digital processor.

17. A switchable path power amplifier as recited in claim 16 wherein the switchable path power amplifier is for use within a cellular transmission system.

18. A switchable path power amplifier as recited in claim 17 wherein the cellular transmission system adheres to a code division multiple access (CDMA) system and the state of the switchable path power amplifier is defined in part by the CDMA system state.

19. A switchable path power amplifier as recited in claim 1 wherein the first and second power devices are formed within a single integrated circuit.

20. A switchable path power amplifier as recited in claim 19 wherein the combining network device and the single integrated circuit are combined within one integrated circuit package.

21. A switchable path power amplifier as recited in claim 1 wherein the switchable path power amplifier has a plurality of power devices intended for use during a plurality of operating states of the switchable path power amplifier.

22. A switchable path power amplifier as recited in claim 1 wherein the first power device is a linear power device.

23. switchable path power amplifier as recited in claim 1 wherein the first power device is a nonlinear power device.

24. A switchable path power amplifier suitable for use in an RF communications system having a first output power level that corresponds to the highest output power required of the RF communications system and a second output power level that corresponds to the output power at which the RF communications system typically operates the switchable path power amplifier comprising:
- a first power device substantially optimized or power efficient signal amplification at the first output power level;
- a second power device substantially optimized for power efficient signal amplification at the second output power level;
- state determination circuitry arranged to determine the power level at which the switchable path power amplifier is operating the state determination circuitry further operable to a) enable the first power device and disable the second power device when the switchable path power amplifier is operating at the first output power level and b) enable the second power device and disable the first power device when the switchable path power amplifier is operating at the second output power level; and
- a combining network arranged to decouple a disabled power device from an output load coupled to the switchable path power amplifier such that any effect of the disabled power device upon an amplified electrical signal generated by an enabled power device is negligible, the state determination circuitry and the combining network operable to select between the first and second power devices without interrupting signal output of the switchable path power amplifier.

25. A switchable path power amplifier as recited in 24 wherein the combining network includes:
- an inductor L1 having first and second terminals, the first inductor L1 terminal electrically coupled to the first power device;
- a capacitor C1 having first and second terminals;
- an inductor L2 having first and second terminals, the first inductor L2 terminal being coupled to a common ground reference, and the second inductor L2 terminal, the second inductor L1 terminal, and the first capacitor C1 terminal being coupled together;
- a transmission line having first and second terminals, the first transmission line terminal, the second capacitor C1 terminal, and the power amplifier output being coupled together;
- a capacitor C2 having first and second terminals, the second capacitor terminal C2 being coupled to the common ground reference;
- a capacitor C3 having first and second terminals, the first capacitor C3 terminal, the first capacitor C2 terminal, and the second transmission line terminal being coupled together;
- an inductor L3 having first and second terminals, the first inductor L3 terminal being coupled to the common ground reference; and
- an inductor L4 having first and second terminals, the first inductor L4 terminal being coupled to the second power device, the second inductor L4 terminal, the second inductor L3 terminal, and the second capacitor C2 terminal being coupled together.

26. A switchable path power amplifier as recited in claim 25 wherein the combining network device further includes a diode serving as the electrical coupling between the first inductor L1 terminal and the first power device, the anode of the schottky diode coupled to the first inductor L1 terminal and the cathode of the schottky diode coupled to the first power device.

27. A switchable path power amplifier as recited in claim 26 wherein the diode is a schottky diode.

28. A switchable path power amplifier as recited in claim 24 wherein the first power device includes a first transistor having a collector that is a first power device output, and the second power device includes a second transistor having a collector that is a second power device output.

29. A switchable path power amplifier as recited in claim 28 wherein the first and second transistors are npn transistors.

30. A switchable path power amplifier as recited in claim 28 wherein the first and second transistors are field effect transistors.

31. A switchable path power amplifier as recited in claim 24 wherein the state determination circuitry includes circuitry for sensing an output power.

32. A switchable path power amplifier as recited in claim 24 wherein the state determination circuitry includes a digital processor.

33. A switchable path power amplifier as recited in claim 32 wherein the switchable path power amplifier is for use within a cellular transmission system.

34. A switchable path power amplifier as recited in claim 33 wherein the cellular transmission system adheres to a code division multiple access (CDMA) system and the power level of the switchable path power amplifier is defined in part by the CDMA system state.

35. A switchable path power amplifier as recited in claim 24 wherein the first and second power devices are formed within a single integrated circuit.

36. A switchable path power amplifier as recited in claim 35 wherein the combining network device and the single integrated circuit are combined within one integrated circuit package.

37. A switchable path power amplifier as recited in claim 24 wherein the switchable path power amplifier has a plurality of power devices intended for use during a plurality of operating power levels of the switchable path power amplifier.

38. A switchable path power amplifier as recited in claim 24 wherein the first power device is a linear power device.

39. A switchable path power amplifier as recited in claim 38 wherein the second power device is a linear power device.

40. A switchable path power amplifier as recited in claim 38 wherein the second power device is a nonlinear power device.

41. A method for amplifying an electrical signal over multiple power levels, the amplified electrical signal driving an output load, the method comprising the acts of:
- providing a switchable path power amplifier including first and second power devices, the first power device intended for amplifying the electrical signal during a first power level, and the second power device intended for amplifying the electrical signal during a second power level;
- determining the power level of the switchable path power amplifier;

when the power level is at the first power level, selecting the first power device for use in amplifying the electrical signal; and when the power level is at the second power level, selecting the second power device for u se in amplifying the electrical signal.

42. A method as recited in claim 41 wherein the act of determining the power level of the switchable path power amplifier includes the act of measuring a power level of the amplified electrical signal.

43. A method as recited in claim 42 wherein the switchable path power amplifier is part of a cellular communications system and the act of determining the power level of the switchable path power amplifier includes the act of determining what power level is specified by the cellular communications system.

44. A method as recited in claim 41 wherein the step of selecting the first power device for use in amplifying the electrical signal includes the acts of:

enabling the first power device;

disabling the second power device; and decoupling the second power device from the output load such that any effect of the second power device upon the amplified electrical signal is negligible.

45. A method as recited in claim 44 wherein the act of selecting the second power device for use in amplifying the electrical signal includes the acts of:

enabling the second power device;

disabling the first power device; and decoupling the first power device from the output load such that any effect of the first power device upon the amplified electrical signal is negligible.

46. A switchable path power amplifier as recited in claim 6 wherein the combining network device is a mechanical relay coupled between the first power device output, the second power device output, and the power amplifier output.

* * * * *

UNITED STATES PATENT AND TRADEMARK OFFICE
CERTIFICATE OF CORRECTION

PATENT NO.   : 6,359,514 B1                                                  Page 1 of 1
DATED        : March 19, 2002
INVENTOR(S)  : Joel R. King et al.

It is certified that error appears in the above-identified patent and that said Letters Patent is hereby corrected as shown below:

Column 1,
Line 7, reads "filing" it should read -- of filing --;

Column 3,
Line 1, reads "capacitor C2 termninal, and the second transmission line"; it should read -- capacitor C2 terminal, and the second transmission line --

Column 7,
Line 25, reads "tially constant gain, the switchable path power amplitier"; it should read -- tially constant gain, the switchable path power amplifier --;
Line 34, reads "tor use during a first operating state of the switchable"; it should read -- for use during a first operating state of the switchable --;

Column 9,
Line 14, reads "a first power device substantially optimized or power"; it should read -- a first power device substantially optimized for power --;

Signed and Sealed this

Third Day of September, 2002

Attest:

JAMES E. ROGAN
Attesting Officer                Director of the United States Patent and Trademark Office